(12) United States Patent
Crippa et al.

(10) Patent No.: US 7,889,586 B2
(45) Date of Patent: Feb. 15, 2011

(54) CIRCUIT AND METHOD FOR RETRIEVING DATA STORED IN SEMICONDUCTOR MEMORY CELLS

(76) Inventors: Luca Crippa, Via Manzoni, 66, I-200040 Busnago (MI) (IT); Giancarlo Ragone, Vico 3° Micarè, 43, I-89047 Roccella Jonica (RC) (IT); Miriam Sangalli, Via XXV Aprile, 11D, I-20061 Carugate (MI) (IT); Rino Micheloni, Via Luini, 11, I-22078 Turate (CO) (IT)

( * ) Notice: Subject to any disclaimer, the term of this patent is extended or adjusted under 35 U.S.C. 154(b) by 146 days.

(21) Appl. No.: 12/248,843

(22) Filed: Oct. 9, 2008

(65) Prior Publication Data

US 2009/0262593 A1    Oct. 22, 2009

Related U.S. Application Data

(62) Division of application No. 11/444,892, filed on May 31, 2006, now Pat. No. 7,474,577.

(30) Foreign Application Priority Data

May 31, 2005   (EP)   ................... 05104656

(51) Int. Cl.
*G11C 7/04* (2006.01)
(52) U.S. Cl. ........................................ 365/211
(58) Field of Classification Search .................. 365/211
See application file for complete search history.

(56) References Cited

U.S. PATENT DOCUMENTS

| 5,864,504 | A | 1/1999 | Tanzawa et al. |
| 6,016,271 | A | 1/2000 | Rolandi et al. |
| 6,452,437 | B1 | 9/2002 | Takeuchi et al. |
| 2002/0181277 | A1* | 12/2002 | Micheloni et al. ........ 365/185.2 |
| 2003/0189856 | A1 | 10/2003 | Cho et al. |
| 2003/0210598 | A1 | 11/2003 | Alexander et al. |
| 2005/0146918 | A1 | 7/2005 | Ogiwara et al. |
| 2005/0213387 | A1* | 9/2005 | Kubo et al. ............ 365/185.21 |
| 2007/0247957 | A1 | 10/2007 | Miwa |

FOREIGN PATENT DOCUMENTS

| EP | 1 460 637 A | 9/2004 |
| EP | 05 10 4656 | 10/2005 |

\* cited by examiner

*Primary Examiner*—Hoai V Ho
*Assistant Examiner*—Anthan T Tran
(74) *Attorney, Agent, or Firm*—Blakely, Sokoloff, Taylor & Zafman LLP

(57) ABSTRACT

A circuit comprises at least one memory cell adapted to store data in terms of values of an electrical characteristic thereof, which exhibits a variability with temperature according to a first variation law; a voltage generator is provided for generating a voltage to be supplied to the at least one memory cell for retrieving the data stored therein, the voltage generator including first means adapted to cause the generated voltage take a value in a set of target values including at least one target value, corresponding to an operation to be performed on the memory cell. The voltage generator comprises second means for causing the value taken by the generated voltage vary with temperature according to a prescribed second variation law exploiting a compensation circuit element having said electrical characteristic.

16 Claims, 4 Drawing Sheets

CIRCUIT AND METHOD FOR RETRIEVING DATA STORED IN SEMICONDUCTOR MEMORY CELLS

PRIORITY CLAIM

This is a Divisional Application of Serial No. 11/444,892, filed May 31, 2006 which is now U.S. Pat. No. 7,474,577 and claims the priority from European Patent Application No. EP 05104656.3, filed May 31, 2005.

TECHNICAL FIELD

The present invention generally relates to the field of integrated circuits and, particularly, to integrated circuits including non-volatile semiconductor memories, such as electrically programmable memories. More specifically, the invention relates to an improved circuit for retrieving data stored in memory cells.

BACKGROUND

Non-volatile memories are commonly used in several applications when the data stored in the memory need to be preserved even when the power supply is off. Within the class of non-volatile memories, the electrically programmable (and erasable) memories, such as flash memories, have become very popular in applications in which the data to be stored are not immutable (as it might be, e.g., the case of a consolidated code for a microprocessor), being instead necessary from time to time to store new data, or to update the data already stored.

The non-volatile memories include a plurality of memory cells; a typical non-volatile memory cell consists of a MOS transistor whose threshold voltage is varied for storing the desired information, for example by injecting charges into a floating gate thereof. Particularly, different program levels of the memory cells correspond to respective threshold voltage value ranges, in turn associated with respective logic values. Accordingly, the memory cells in determined biasing states are conductive or not conductive depending on the information stored therein.

Typically, a flash memory includes a matrix of memory cells, and, depending on the way the memory cells in the matrix are interconnected, two classes of flash memories can be identified: those having a so-called NOR architecture, or NOR flash memories, and those having a so-called NAND architecture, shortly referred to as NAND flash memories. Roughly speaking, in both the architectures each matrix row is connected to a respective word line, but while in a NOR architecture the memory cells of a same matrix column are connected in parallel to a same bit line, in a NAND architecture groups of memory cells of a same matrix column are serially interconnected one to another so as to form respective strings, which strings are then connected in parallel to each other to a same bit line.

In order to perform a read operation on, for example, a NAND memory, a word line, to which a selected memory cell belongs, is biased to a given read voltage, typically intermediate between a first threshold voltage value, associated with a first logic value, and a second threshold voltage value, associated with a second logic value, respectively. The remaining word lines, controlling the other memory cells of the same string, are all kept at a voltage sufficiently high to ensure that these memory cells are turned on irrespective of their program level. In this way, the selected memory cell is conductive only when biased at a read voltage higher than the threshold voltage thereof. Accordingly, the read voltage values are exploited for discriminating the program levels of the memory cells in reading conditions.

Typically, the read voltages are supplied by a voltage generator included in the memory. For optimizing read voltage margins between two adjacent program levels, the voltage generator should supply read voltages approximately located halfway between the threshold voltage values corresponding to the two adjacent program levels.

Voltage generators known in the art are implemented and dimensioned in such a way as to supply predetermined read voltages, whose values depend on the program levels associated with the information stored in the flash memory.

The ever increasing need for high density memory sizes and the industrial need of a reduction of the cost for storage have led to the development of techniques in which a single memory cell is adapted to store more than a single bit. In particular, in order to store more than one bit in the same memory cell, more than two different threshold voltage ranges, or program levels, for the cells need to be defined: for this reason, these memory cells are referred to as multilevel.

The constant trend for reduced feature size manufacturing processes causes a reduction of the read margins, which, particularly, become smaller and smaller (also of few hundreds of millivolts) in a multilevel memory.

Furthermore, it has to be considered that the threshold voltages of the memory cells are sensitive to temperature variations. In particular, the threshold voltages tend to decrease with an increase of temperature, and vice versa; in particular, the threshold voltage varies of an amount of the order of millivolts for a degree centigrade. Accordingly, the small read margins of a multilevel memory are further reduced because of temperature variations, then increasing a probability of an incorrect reading of the memory cells.

SUMMARY

In view of the state of the art outlined in the foregoing, one of the problems that the Applicant has faced has been how to provide a voltage generator that allows optimizing the read margins in operations on a memory cell, particularly in respect of the variability with temperature of the threshold voltage.

The Applicant has found that the read margin can be rendered less dependent, or even essentially independent from the operating temperature by causing the voltage(s), that is(are) generated and supplied to the memory cells for retrieving data stored therein, to vary with temperature in such a way to at least partially compensate variations with the temperature of the memory cells' threshold voltage.

According to one aspect of the present invention, a circuit includes at least one memory cell adapted to store data in terms of values of an electrical characteristic thereof, said electrical characteristic exhibiting a variability with temperature according to a first variation law; and a voltage generator for generating a voltage to be supplied to the at least one memory cell for retrieving the data stored therein, the voltage generator including first means adapted to cause the generated voltage take a value in a set of target values including at least one target value, corresponding to an operation to be performed on the memory cell. The voltage generator comprises second means for causing the value taken by the generated voltage to vary with temperature according to a prescribed second variation law exploiting a compensation circuit element having said electrical characteristic.

BRIEF DESCRIPTION OF THE DRAWINGS

The features of the present invention will be made apparent by the following description of a preferred embodiment thereof, provided merely by way of non-limitative example, description that will be conducted making reference to the attached figures, in which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
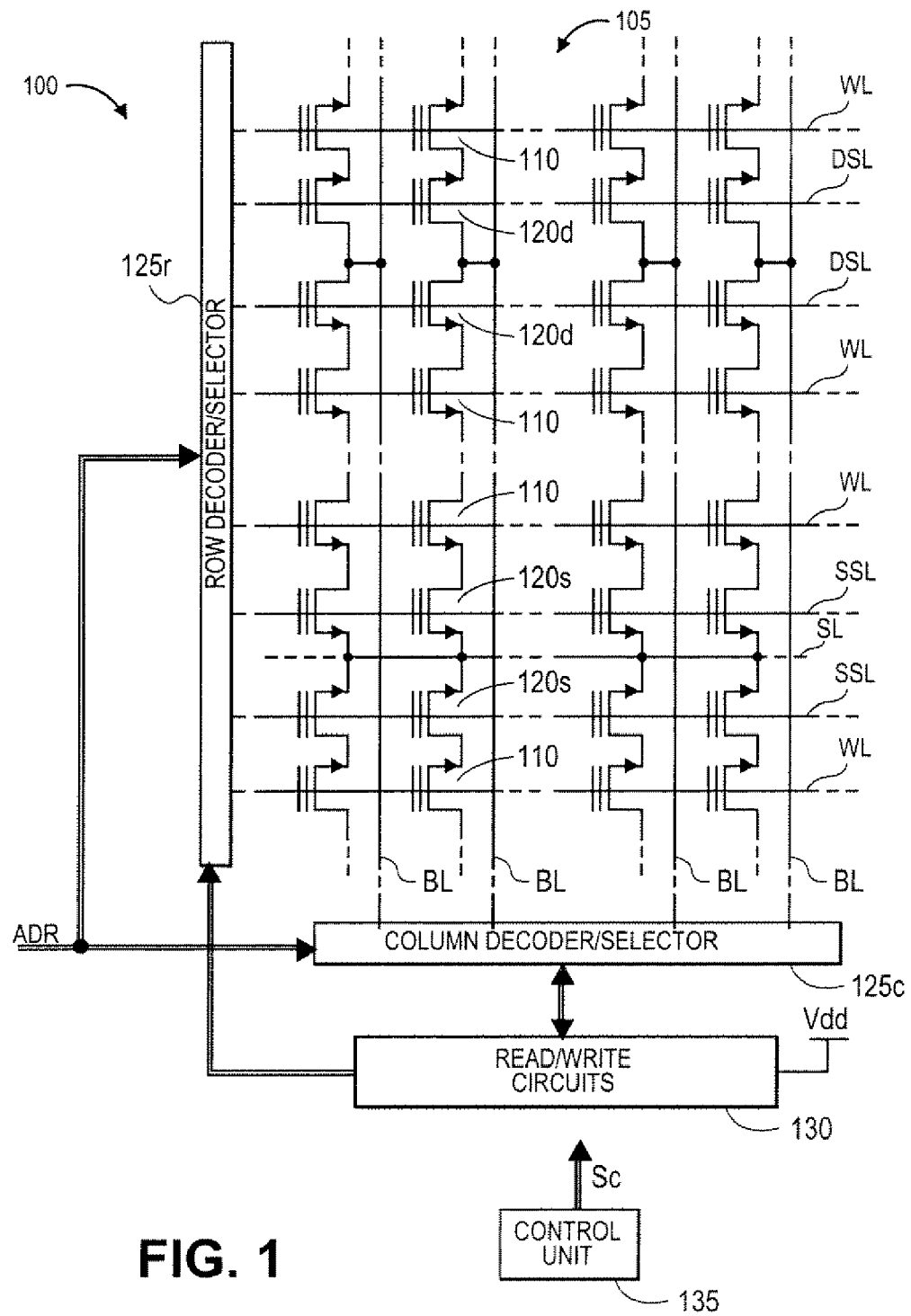
FIG. 1 schematically shows the functional blocks of a NAND flash memory relevant to the understanding of the embodiments of the present invention to be described.

With reference to the drawings, in FIG. 1 a non-volatile semiconductor memory, globally identified as 100, is illustrated, particularly an electrically-programmable, non-volatile semiconductor memory, for example a flash memory, in which embodiments of the present invention are applicable.

The flash memory 100 is integrated in a chip of semiconductor material, and includes a matrix 105 of memory cells 110, arranged in a plurality of rows and a plurality of columns.

Typically, each memory cell 110 consists of an N-channel MOS transistor having a charge-storage element, such as a conductive floating gate adapted to be charged by injected electrons. Without entering into excessive details, well known to those skilled in the art, a threshold voltage of the memory cell 110 can be varied, i.e., the memory cell 110 can be programmed to a given level, by injecting a given amount of charge in the floating gate thereof. Then, each program level of the memory cell 110 is associated with corresponding ranges of the threshold voltage and represents a logic value stored in the memory cell 110. In other words, the generic memory cell 110 is capable of storing data in terms of different values taken by an electrical characteristic thereof, namely its threshold voltage.

In particular, in the case the memory cells 110 are multilevel memory cells, each memory cell 110 can be programmed to a plurality of levels, four in the example herein considered. Typically, albeit not restrictively, a number L of levels is a power of 2; therefore, a memory cell 110 with $L=2^B$ levels stores a logic value consisting of B bits of information. Then, a quadrilevel memory cell stores a logic value which consists of two information bits $B_1B_0$, i.e., the logic values "11", "10", "00" and "01", by convention associated with increasing values of the threshold voltage. In detail, in an erased condition, associated by convention with a logic value "11", the generic memory cell 110 has a low threshold voltage value; in the programmed conditions, associated by convention with the logic values "10", "00" and "01", the memory cell 110 has respective, increasing threshold voltage values. It is pointed that that the one just described is merely a possible convention, and that other conventions can be adopted.

Therefore, when a generic memory cell 110 is selected and biased for reading its content, either for retrieving the data stored therein, or for verifying a correct completion of a program operation on the memory cell, the memory cell 110 will be conductive only if the gate-to-source biasing voltage is higher than the threshold voltage thereof.

The flash memory 100 has, for example, a so-called NAND architecture: in the matrix 105, groups of, e.g., eight, sixteen or even more (such as thirty-two or sixty-four) memory cells 110 are connected in series to each other to form a respective memory cells string, and different memory cells strings belonging to a same matrix column are connected in parallel to each other to a same bit line BL.

The memory cells 110 of a generic string are in particular connected in series between a source select N-channel MOS transistor 120s and a drain select N-channel MOS transistor 120d. A generic, intermediate memory cell 110 in the string of memory cells has the drain terminal connected to the source terminal of an adjacent memory cell 110, and the source terminal connected to the drain terminal of another adjacent memory cell 110. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the other end memory cell 110 of the string has the source terminal connected to the drain terminal of the source select transistor 120s; the source terminal of the source select transistor 120s is connected to the source terminal of the corresponding source select transistor 120s of another adjacent memory cells string.

The control gate terminals of the memory cells 110 in each matrix row are connected to a corresponding word line WL. The gate terminals of the drain select transistors 120d belonging to a common row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a common column of the matrix 105 are connected to a corresponding bit line BL. Conversely, the source terminals of all the source select transistors 120s in the matrix 105 are connected to a common source line SL (which is typically kept at a reference voltage, or ground).

The memory cells 110 belonging to a same row of the matrix 105 may be logically partitioned into memory pages. Assuming, merely by way of example, that the matrix 105 includes two memory pages for each word line WL, a first page consists for example of the memory cells 110 in an even position, and a second page consists of the memory cells 110 in an odd position.

The flash memory 100 receives an address code ADR for selecting a desired memory page. A portion of the address code ADR is supplied to a row decoder/selector 125r, which selects the desired word line WL, as well as the corresponding drain select line DSL and the corresponding source select line SSL. Another portion of the address code ADR is supplied to a column decoder/selector 125c, which selects a desired packet of bit lines BL.

The row decoder/selector 125r and the column decoder/selector 125c interface with read/write circuits 130 which are meant to include all the components which are normally required for writing desired logic values into the selected memory cells 110, and for reading logic values currently stored therein. Particularly, the read/write circuits 130 include voltage generators and boosters (such as charge pumps), and a page buffer exploited as a temporary storage during read/write operations on the memory cells 110 of the selected page.

The read/write circuits 130 provide to the row and column decoder/selectors 125r and 125c operating voltages that take values in accordance with the specific operation to be performed on the memory cells 110, and a reference voltage (such as ground) starting from a supply voltage Vdd (for example, in a range between 2.7 V and 3.6 V) of the flash memory 100.

The operation of the flash memory 100 is generally managed by a control unit, schematized as a block identified as 135 (for example, a microcontroller), which outputs a plurality of control signals, denoted as a whole with Sc to be provided to corresponding blocks of the flash memory 100.

During a program operation, a data word to be written, received from outside the memory, for example from an external microprocessor, is loaded into the page buffer of the read/write circuits 130; the data are then written in parallel into the memory cells 110 of the selected page.

In order to access a selected memory cell 110 for programming it, the drain select transistor 120d in the memory cell string to which the cell belongs is turned on by asserting the drain select line DSL, i.e. the row decoder/selector 125r brings this line, for example, to the supply voltage Vdd, whereas the source select transistor 120s is kept off by keeping the source select line SSL de-asserted (e.g., grounded). The bit line BL, to which the memory cells string containing the memory cell 110 to be programmed is connected, is selected by the column decoder/selector 125c.

The row decoder/selector 125r biases the word line WL, to which the selected memory cell belongs, to a relatively high program voltage, e.g. 20 V, provided by the read/write circuits 130. The remaining word lines WL, controlling the gates of the other memory cells 110 of the same string, are all brought to a voltage different from, particularly lower than, the program voltage applied to the selected word line WL, nonetheless sufficiently high to ensure that these memory cells 110 are turned on irrespective of their programming state, but sufficiently lower than the program voltage not to cause spurious programming (a suitable voltage is for example approximately 10 V). All the other word lines WL, associated with different memory cells strings, are for example kept grounded.

In order to program the selected memory cell 110, the corresponding bit line BL is kept grounded by the column decoder/selector 125c, so that the drain select transistor 120d is surely kept on. The ground voltage at the bit line BL, propagating through the drain select transistor 120d and the channel of the memory cells 110 in the string, reaches the channel of the memory cell 110 to be programmed; here, the voltage difference between the control gate and the channel experienced by the selected memory cell 110 is sufficient to cause electron tunneling into the floating gate.

On the contrary, if the bit line BL is biased by the column decoder/selector 125c at a higher voltage, for example equal to the supply voltage Vdd like the drain select line DSL, the drain select transistor 120d turns off as soon as the voltage of the memory cells string rises (due to the capacitive coupling) following the voltage applied to the word lines WL. The channels of the memory cells 110 of the selected memory cells string thus remain floating, and the string channel voltage rises to a value such that the control gate-to-channel voltage difference at the selected memory cell 110 is not sufficient to cause significant electron tunneling, and the memory cell 110 is not programmed.

In this way, by applying to the selected bit lines BL the proper voltage, the memory cells 110 of the selected word line WL to be written into the desired logic value are programmed, while the other cells 110 are left unchanged.

During a program operation on the multilevel flash memory 100, the value of the program voltage at the word line WL is usually increased step-by-step, starting from an initial value until the threshold voltage of the multilevel memory cell 110 to be programmed falls in the desired threshold voltage range, i.e. until the multilevel memory cell 110 is programmed to the level corresponding to the desired logic value.

In detail, at a first step a program voltage pulse, an amplitude thereof taking an initial voltage value, is applied to the selected word line WL and, successively, a program-verify operation is performed for verifying the completion of the program operation on the selected memory cell 110.

The program-verify operation consists of biasing the corresponding word line WL at a predetermined program-verify voltage, provided by the read/write circuits 130; the program-verify voltage corresponds to the voltage range in which the threshold voltage of the selected memory cell 110 is intended to fall, i.e. to the logic value to be programmed into the memory cell 110. Particularly, the program-verify voltage may correspond to a lower limit of the desired threshold voltage range. In this way, if the selected memory cell 110 is seen as non-conductive when confronted with the proper program-verify voltage, the program operation is considered completed.

If the selected memory cell 100 is instead seen as conductive, at a second step a second program voltage pulse, an amplitude thereof taking a value higher than the initial value, is applied to the selected word line WL and a further program-verify operation is performed.

Figure 2:
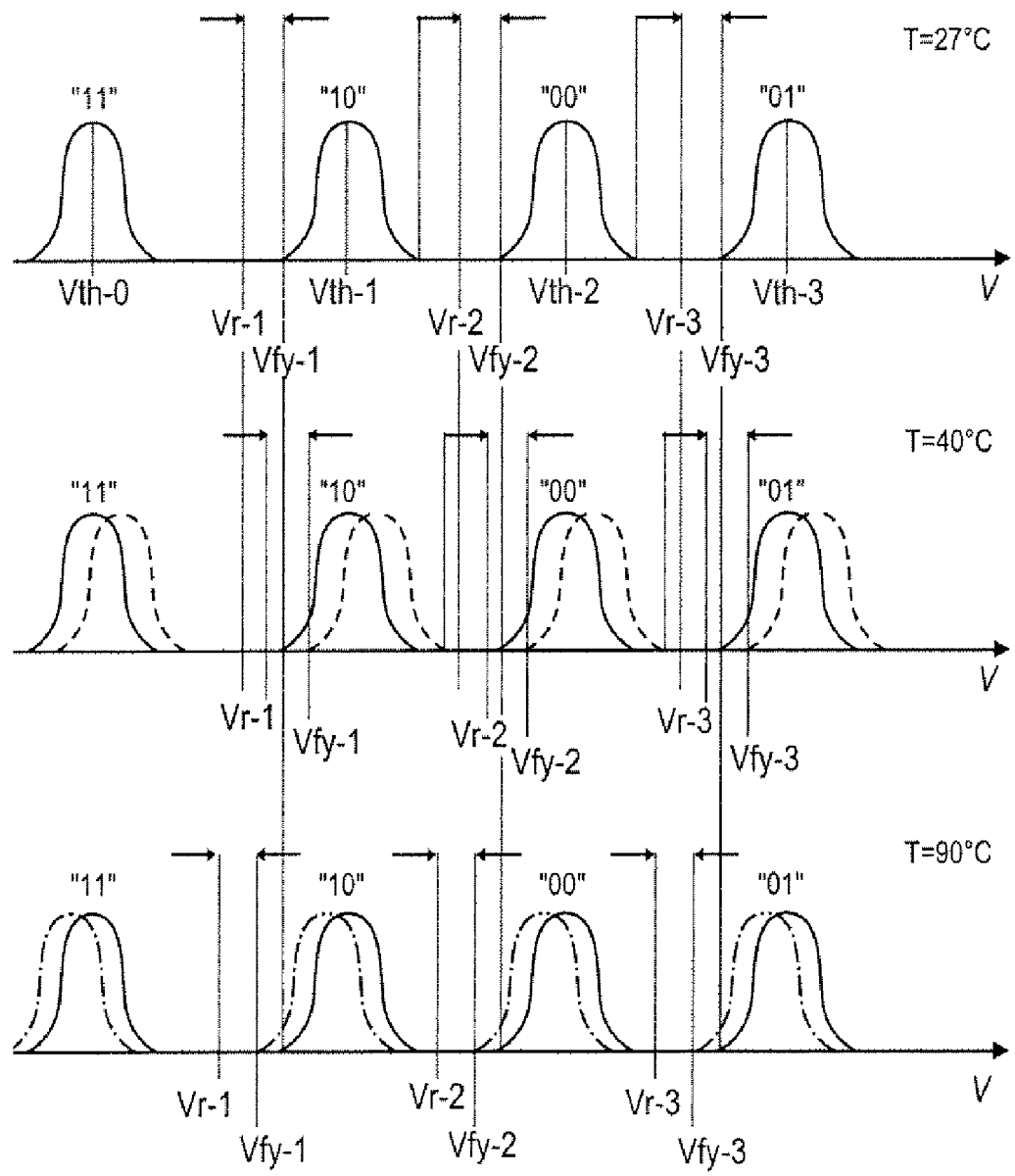
FIG. 2 schematically shows statistical distributions of threshold voltages of memory cells included in the NAND flash memory of FIG. 1 after a program operation, and variations of such distributions with temperature.

The program operation proceeds in this way step-by-step until the threshold voltage of the selected memory cell 110 falls in the desired voltage range, centered around a threshold voltage value corresponding to a given logic value and having the corresponding program-verify voltage as lower limit. Considering the whole matrix 105 of multilevel memory cells 110, statistical distributions of the memory cell threshold voltages are schematically shown in FIG. 2, each distribution being centered around a respective threshold voltage value Vth-0, Vth-1, Vth-2, Vth-3 corresponding to the respective logic value "11", "10", "00", "01"; the threshold voltage values are taken on an axis V.

In particular, the erased memory cells 110, storing the logic value "11", exhibit a low threshold voltage in a first voltage range centered around the threshold voltage value Vth-0, for example a negative voltage of approximately −1.5 V to −2 V. The memory cells 110 storing the logic value "10" exhibit a threshold voltage in a second voltage range centered around the threshold voltage value Vth-1, for example of approximately 0.6 V, higher than the threshold voltage value Vth-0, but lower than the threshold voltage value Vth-2, for example of approximately 1.9 V, which a third voltage range is centered around; the memory cells 110 showing a threshold voltage in the third voltage range stores the logic value "00". The memory cells 110 storing the logic value "01" exhibit a threshold voltage in a fourth voltage range centered around the threshold voltage value Vth-3, for example of approximately 3.3 V, higher than the threshold voltage values Vth-0, Vth-1 and Vth-2.

Typically, in a multilevel memory the distance in voltage between two adjacent voltage ranges, i.e. the distance between a left extreme of a generic threshold voltage range and a right extreme of the adjacent threshold voltage range, is very small, of the order of hundreds of millivolts, for example, about 600 mV.

The program-verify voltages may correspond to the left extremes Vfy-1, Vfy-2 and Vfy-3 of the second, third and fourth voltage ranges, respectively. For example, the program-verify voltages Vfy-1, Vfy-2 and Vfy-3 may take values of approximately 0.3 V, 1.6 V and 3.0 V, respectively.

During a program operation in which a selected memory cell 110 has to be programmed at the level corresponding to, for example, the logic value "01", a first program pulse is applied to the memory cell, for example biasing the selected word line WL at a program voltage corresponding to the threshold voltage value Vth-2 or, more typically, by applying to the word line WL a voltage value corresponding to a first step of a predetermined voltage ramp. Successively, in a program-verify operation the selected word line WL is biased at the program-verify voltage Vfy-2; if the selected memory cell 110 is seen as non-conductive, then the threshold voltage thereof fails in the third threshold voltage range (corresponding to the logic value "00") and the program operation is considered completed. If the selected memory cell 110 is seen as conductive, then the program voltage is increased at a successive step, and so on.

Hereinafter, a read operation on the memory cells 110 is described with reference to FIG. 1 in conjunction with FIG. 2.

In order to access a given memory cell 110 for reading the content thereof, the drain select transistor 120d and the source select transistor 120s in the memory cells string to which the memory cell 110 belongs are turned on, by asserting the drain select line DSL and the source select line SSL (for example, these two lines are brought to the memory supply voltage Vdd by the row decoder/selector 125r). The bit line BL, to which the memory cells string containing the memory cell 110 to be read is connected, is selected by the column decoder/selector 125c.

Assuming that a so-called "serial sensing" technique is adopted for sensing the multilevel memory cells, the row decoder/selector 125r biases the word line WL, to which the selected memory cell 110 belongs, in sequence to different read voltages, intermediate between each threshold voltage value Vth-i and the threshold voltage value Vth-(i−1), where i=1, 2, 3 is an index. In detail, the row decoder/selector 125r biases this word line WL in sequence to a first read voltage Vr-1 (for example, the ground voltage), intermediate between the threshold voltage value Vth-1 and the threshold voltage value Vth-0, then to a second read voltage Vr-2 (for example, equal to about 1.3 V), intermediate between the threshold voltage value Vth-2 and the threshold voltage value Vth-1, and then to a third read voltage Vr-3 (for example, equal to about 2.7 V), intermediate between the threshold voltage value Vth-3 and the threshold voltage value Vth-2. Other approaches are possible, such as for example a so-called "serial-dichotomic" approach.

The read voltage values Vr-i are preferably chosen so as to fall halfway between two adjacent threshold voltage distributions, i.e. equal to the mean point in the voltage distance between two adjacent distributions. This solution allows the optimization of read voltage margins between the read voltage value Vr-i and the right extreme of the distribution centered around the threshold voltage value Vth-(i−1), and between the read voltage value Vr-i and the left extreme of the distribution centered around the threshold voltage value Vth-i; these read margins are typically very small in a multilevel memory, and for example of about 300 mV.

The remaining word lines WL, controlling the gates of the other memory cells 110 of the same string, are all kept to a voltage (for example, a voltage of approximately 5 V) sufficiently high to ensure that these memory cells 110 are turned on irrespective of their program level. All the other word lines WL, associated with different memory cells strings, are for example kept grounded.

In this way, the selected memory cell 110 is conductive only when it is biased at a read voltage Vr-i higher than the threshold voltage thereof. Accordingly, the read voltage values Vr-1, Vr-2 and Vr-3 are exploited for discriminating the four possible program levels of the quadrilevel memory cells 110 in reading conditions, particularly, each pair of adjacent logic values is discriminated by using the corresponding read voltage value Vr-i (i=1, 2, 3).

When the selected memory cell 110 is conductive, the read/write circuits 130 read, for example, a high logic value "1" at the corresponding selected bit line BL; on the contrary, when the selected memory cell 110 is not conductive, the read/write circuits 130 read, for example, a low logic value "0" By applying in sequence the three different read voltages Vr-1. Vr-2 and Vr-3 to the selected word line WL, three respective logic values are read in sequence at the corresponding selected bit line BL by the read/write circuits 130. This sequence of three logic values "1" or "0" is decoded by the read/write circuits 130 as a combination corresponding to the two information bits $B_1B_0$ stored in the selected memory cell 110.

As discussed in the introductory part of the present description, the memory cells' threshold voltages, and thus the threshold voltage distributions of the memory cells 110 are sensitive to temperature variations; in particular, the threshold voltages tend to decrease with an increase of temperature, and vice versa. In FIG. 2 the threshold voltage distributions are shown for three different temperature values T of 90° C., 27° C. and −40° C. Particularly, the threshold voltage distributions at 27° C., a typical temperature under normal operating conditions, are drawn in solid line. The threshold voltage distributions at −40° C. are drawn in dashed line and shifted to the right of the threshold voltage distributions at 27° C., i.e. towards higher threshold voltage values. The threshold voltage distributions at 90° C. are drawn in dashed-and-dot line and shifted to the left of the threshold voltage distributions at 27° C., i.e. towards lower threshold voltage values. Typically, the threshold voltage of a memory cell 110 shifts of an amount of the order of millivolts for degree centigrade, for example of about −1.5 mV/° C.; the sign "−" means that for an increase of temperature the threshold voltage decreases, whereas for a decrease of temperature the threshold voltage increases.

In order to preserve the desired read margins and not reduce them, the read voltages Vr-1, Vr-2 and Vr-3, generated by a voltage generator included in the read/write circuits 130 need to shift in accordance with the threshold voltage of the memory cell 110. In fact, the shift of the threshold voltage is, for example, of about 100 mV in a temperature range between −40° C. and 90° C. with variations of −1.5 mV/° C., i.e. a value of approximately one third of the read margins. Furthermore, also the program-verify voltages Vfy-1, Vfy-2 and Vfy-3 need to shift in accordance with temperature translations, so that the extremes of the threshold distributions are positioned at a substantially fixed distance from the read voltages Vr-1, Vr-2 and Vr-3.

Figure 3:
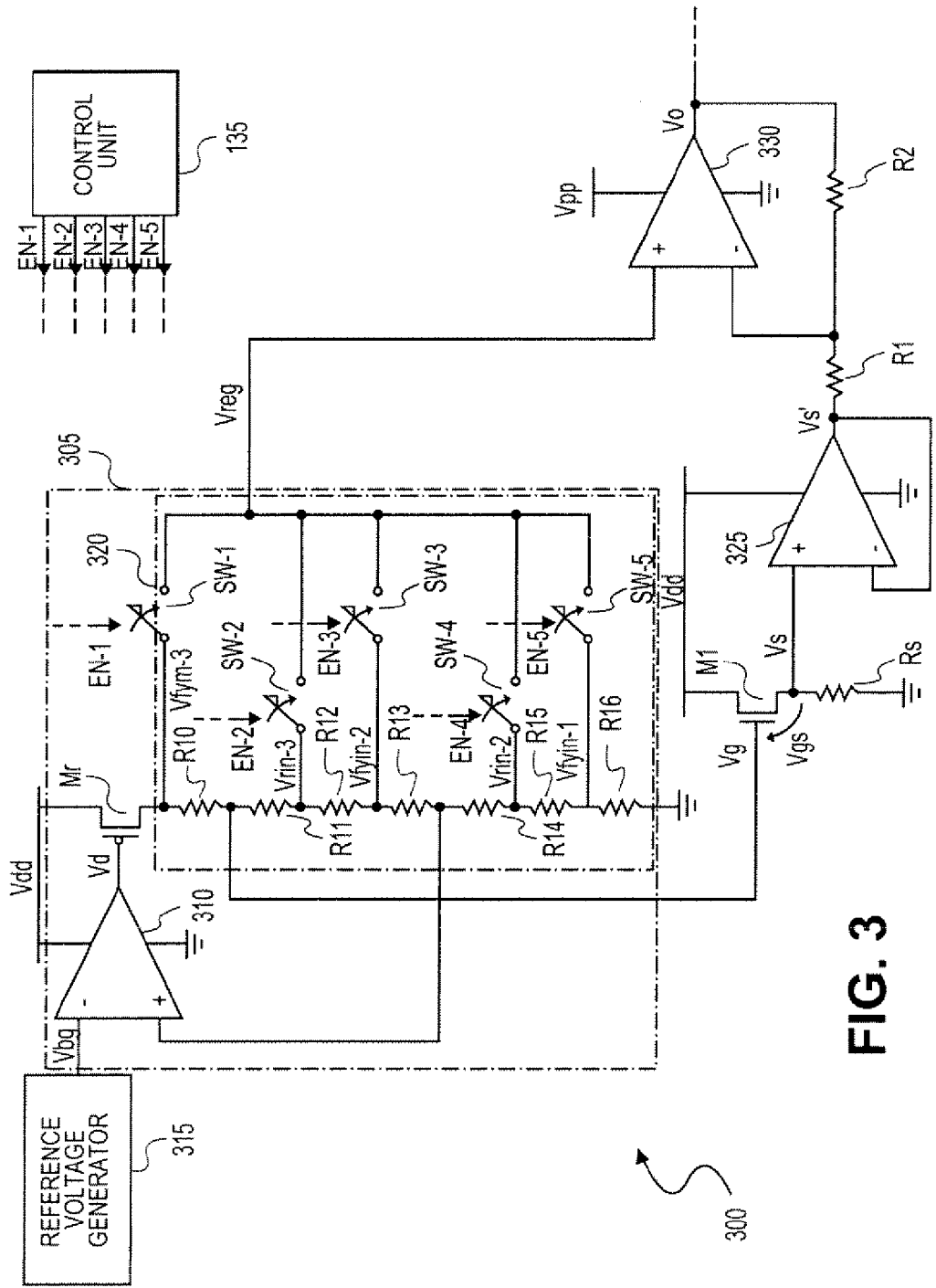
FIG. 3 illustrates a voltage generator, included in read/write circuits of the NAND flash memory of FIG. 1, according to an embodiment of the present invention.

Referring to FIG. 3, a voltage generator 300, included in the read/write circuits 130 and according to an embodiment of the present invention, is shown The voltage generator 300 generates an operating voltage Vo, adapted to be used as a biasing voltage for the memory cells 110 for accessing them and retrieving the data stored therein The voltage Vo generated by the voltage generator 300 takes values variable with the temperature, in a way tracking the threshold voltages of the memory cells, starting from a reference voltage Vbg which is very stable with the temperature.

The voltage generator 300 includes a voltage regulator 305, which comprises an operational amplifier 310, receiving as voltage supplies the ground and the supply voltage Vdd. The operational amplifier 310 receives, at an inverting input terminal "−" thereof, the reference voltage Vbg, supplied thereto by a reference voltage generator 315 included in the read/write circuits 130. Preferably, the reference voltage generator 315 includes a band-gap reference voltage generator, capable of providing a band-gap reference voltage Vbg which is very stable, particularly against operating temperature variations.

The voltage regulator 305 further includes a p-MOS transistor Mr having the source terminal receiving the supply voltage Vdd, and having a gate terminal connected to an output terminal of the operational amplifier 310, said output terminal supplying a drive voltage Vd.

The voltage regulator 305 further includes a voltage divider 320; the voltage divider 320 in turn comprises a series of, in the example, seven resistors R10, R11, R12, R13, R14, R15 and R16 connected one to another between the drain terminal of the transistor Mr and the ground. Particularly, in the resistor series the resistor R10 has a first terminal coupled to the drain terminal of the transistor Mr and the resistor R16 has a first terminal coupled to ground. The operational amplifier 310 is coupled in negative feed-back to the voltage divider 320 by having a non-inverting input terminal "+" coupled to respective first terminals of the resistors R13 and R14 connected together.

In operation, the voltage regulator 305 is adapted to cause the terminals of the resistors R10, R11, R12, R13, R14, R15 and R16 to reach each one a respective prescribed, regulated voltage, depending on the resistors' resistances and on the values of the reference voltage Vbg and of the supply voltage Vdd.

The resistors R10, R11, R12, R13, R14, R15 and R16 are dimensioned so that, in operation, a regulated voltage Vfyin-3 at the first terminal of the resistor R10, which is coupled to the drain terminal of the transistor Mr, supplying a regulated voltage, corresponds the program-verify voltage Vfy-3 associated with the logic value "01"; a regulated voltage Vrin-3 at the common terminals of the resistors R11 and R12 corresponds to the read voltage Vr-3 exploited for discriminating the logic values "01" and "00"; a regulated voltage Vfyin-2 at the common terminals of the resistors R12 and R13 corresponds to the program-verify voltage Vfy-2 associated with the logic value "00"; a regulated voltage Vrin-2 at the common terminals of the resistors R14 and R15, corresponds to the read voltage Vr-2 exploited for discriminating the logic values "10" and "00"; a regulated voltage Vfyin-1 at the common terminals of the resistors R15 and R16 corresponds to the program-verify voltage Vfy-1 associated with the logic value "10". Concerning the read voltage Vr-1, in the example herein considered it is assumed that such a voltage is the ground voltage; however, in other embodiments, also this read voltage may be obtained in a way similar to the other read or verify voltages.

The voltage divider 320 further includes five switches SW-1, SW-2, SW-3, SW-4 and SW-5, for example consisting each one of a pass gate. The switch SW-1 has a first terminal connected to the first terminal of the resistor R10 and to the drain terminal of the transistor Mr, supplying the regulated voltage Vfyin-3. The switch SW-2 has a first terminal connected to the common terminals of the resistors R11 and R12, supplying the regulated voltage Vrin-3. The switch SW-3 has a first terminal connected to the common terminals of the resistors R12 and R13, supplying the regulated voltage Vfyin-2. The switch SW-4 has a first terminal connected to the common terminals of the resistor R14 and R15, supplying the regulated voltage Vrin-2. The switch SW-5 has a first terminal connected to the common second terminals of the resistors R15 and R16, supplying the regulated voltage Vfyin-1.

The switches SW-1, SW-2, SW-3, SW-4 and SW-5 have respective second terminals connected together, whereat a regulated output voltage Vreg, which is very stable in temperature, being derived by the band-gap reference voltage Vbg, is provided. Each switch SW-1, SW-2, SW-3, SW-4, SW-5 is controlled by a respective enabling signal EN-1, EN-2, EN-3, EN-4, EN-5 provided for example by the control unit 135, which enables one switch SW-1, SW-2, SW-3, SW-4, SW-5 at time in accordance with the desired operation to be performed on the flash memory 100. In this way, depending on which one of the switches SW-1, SW-2, SW-3, SW-4, SW-5 is enabled by the control unit 135, the regulated output voltage Vreg takes a desired value equal to a selected one among the regulated voltages Vfyin-1, Vfyin-2, Vfyin-3, Vrin-2 or Vrin-3.

The voltage divider 320 further supplies a regulated gate control voltage Vg to a gate terminal of an n-MOS transistor Mt included in the voltage generator 300 according to an embodiment of the present invention. In particular, the regulated gate control voltage Vg is taken at the common terminals of the resistors R10 and R11.

The n-MOS transistor Mt has the drain terminal receiving the supply voltage Vdd and the source terminal connected to a first terminal of a source resistor Rs, a second terminal thereof being connected to ground. The source resistor Rs has a relatively high resistance, for example of hundreds of kiloohms, in order to limit a current sunk by the n-MOS transistor Mt to a desired small value, for example of the order of microamperes. In particular, the resistance of the source resistor Rs is such that a gate-source voltage Vgs falling between the gate and source terminals is approximately equal to a threshold voltage Vth of the n-MOS transistor Mt (for example, of about 0.7 V); in other words, the transistor Mt is very slightly turned on (just at the turn-on threshold). Accordingly, the source terminal of the n-MOS transistor Mt reaches a source voltage Vs equal to about $$Vs = Vg - Vth$$

The voltage generator 300 further comprises a buffer 325 consisting of an operational amplifier supplied between the supply voltage Vdd and the ground and having a non-inverting input terminal "+" receiving the source voltage Vs and an inverting input terminal "−" feed-back connected to an output terminal thereof. Accordingly, a buffered voltage Vs' supplied at the output terminal of the buffer 325 is equal to the source voltage Vs.

A further operational amplifier 330 has an inverting input terminal "−" coupled to the output terminal of the buffer 325 by means of a first resistor R1, having a first terminal connected to the output terminal of the buffer 325 and a second terminal connected to the inverting input terminal "−". A non-inverting input terminal "+" of the operational amplifier 330 receives the regulated output voltage Vreg supplied by the voltage regulator 305. In an embodiment of the present invention, the operational amplifier 330 is supplied between a bootstrapped voltage Vpp, higher than the supply voltage Vdd and supplied, for example, by a charge pump of the read/write circuits 130 (not shown in the drawing) and the ground. Furthermore, the operational amplifier 330 has an output terminal coupled in negative feed-back to the inverting input terminal "−" thereof by means of a second resistor R2, having a first terminal connected to the inverting input terminal "−" and a second terminal coupled to the output terminal.

The transistor Mt, the resistor Rs and the buffer 325 form a compensation voltage generator generating a compensation voltage Vs' having a prescribed temperature dependency. The resistors R1 and R2, and the operation amplifier 330 form a voltage combining circuit, combining the voltage Vreg and the compensation voltage Vs', thereby imparting to the voltage Vo a desired temperature dependency.

In operation, the operational amplifier 330 supplies the operating voltage Vo at the output terminal thereof, taking values in accordance with the following relation between the source voltage Vs and the regulated voltage Vreg:

$$Vo = Vreg + \frac{R2}{R1}(Vreg - Vs')$$
$$= Vreg + \frac{R2}{R1}(Vreg - Vs).$$

Accordingly, being $$Vs = Vg - Vgs,$$

it follows:

$$Vo = Vreg + \frac{R2}{R1}(Vreg - Vg + Vgs),$$

i.e., the value of the operating voltage Vo depends on the two voltages Vreg and Vg, which are both very stable in temperature, and on the gate-source voltage Vgs of the transistor Mt, which instead varies with temperature, particularly in the same way as the threshold voltage of the memory cells does.

Preferably, by choosing the resistance values of the resistors R1 and R2 equal to each other, for not having a proportion of the gate-source voltage Vgs, i.e. of the temperature-dependent term, the operating voltage Vo becomes:

$$Vo = 2Vreg - Vg + Vgs.$$

In this way, by the gate-source voltage Vgs being approximately equal to the threshold voltage Vth of the transistor Mt, which has a temperature dependence equal to that of the memory cells 110, the operating voltage Vo varies with temperature in the same way as the threshold voltage of the memory cells 110.

By suitably dimensioning the resistance values of the resistors R10, R11, R12, R13, R14, R15 and R16, the drive gate voltage Vg takes a prescribed value, for example, 1.8 V (the value of the voltage Vg is for example chosen depending on the threshold voltage of the transistor Mt). In order to let the operation voltage Vo take a value equal to the required program-verify voltage Vfy-1, for example of about 0.3 V, when the switch SW-1 is enabled by asserting the control signal EN-1, the value of the regulated voltage Vreg should be equal to $$Vreg = \frac{1}{2}(Vo + Vg - Vgs)$$
$$= \frac{1}{2}(0.3 + 1.8 - 0.7) \text{ V}$$
$$= 0.7 \text{ V}.$$

In order to have the operation voltage Vo take a value equal to the required program-verify voltage Vfy-3, for example of about 2.9 V, when the switch SW-1 is enabled by asserting the control signal EN-1, the value of the regulated voltage Vreg should be equal to $$Vreg = \frac{1}{2}(Vo + Vg - Vgs)$$
$$= \frac{1}{2}(2.9 + 1.8 - 0.7) \text{ V}$$
$$= 2.0 \text{ V}.$$

It has to be observed that in case the supply voltage Vdd is sufficiently high, for example, in a range between 2.7 V and 3.6 V, the voltage regulator 305, providing the regulated voltage Vreg in a range between 0.7 V and 2.0 V, needs not be supplied by a bootstrapped voltage. Also, by supplying the amplifier 330 between the voltage Vpp and a negative voltage lower than the ground voltage, negative output voltage values exhibiting the desired dependency with temperature can be obtained.

Figure 4:
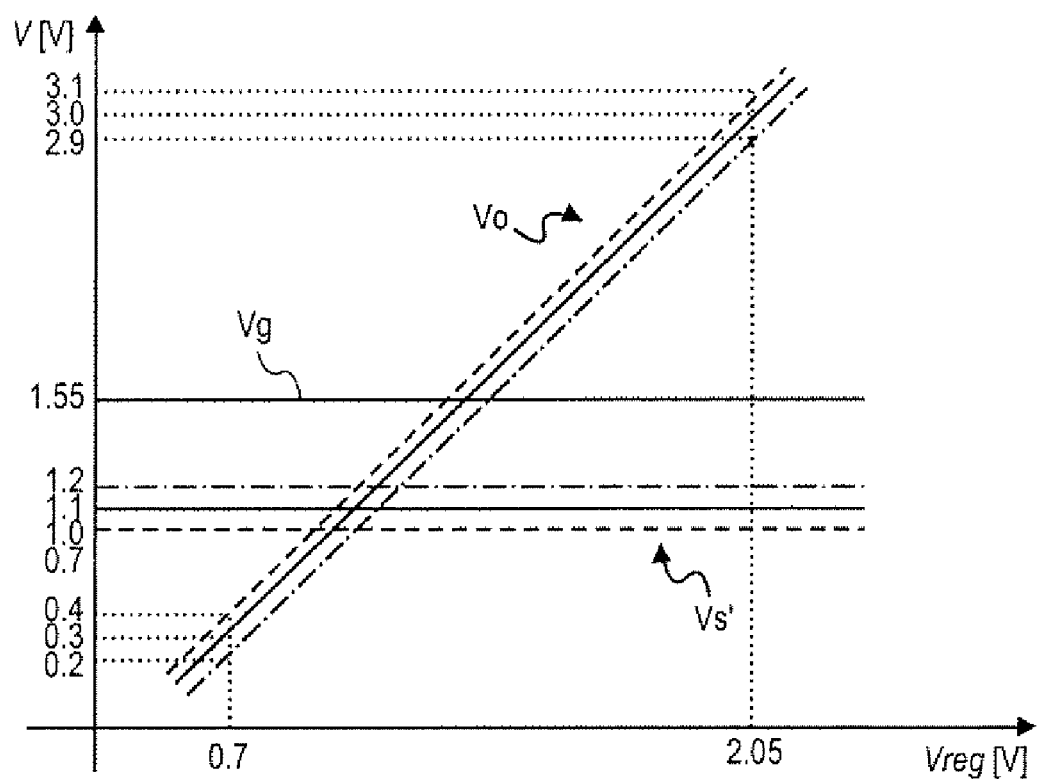
FIG. 4 shows, for different temperature values, curves representing the variation of voltages generated by a voltage generator according to an embodiment of the present invention, obtained by a simulation of the operation of a NAND flash memory including the voltage generator.

With reference to FIG. 4, the operating voltage Vo, the drive gate voltage Vg and the buffered voltage Vs' vs. the regulated voltage Vreg are shown, obtained by a simulation of the operation of a NAND flash memory including a voltage generator according to an embodiment of the present invention. In detail, in the simulation the regulated voltage Vreg is varied between 0.7 V and 2.1 V, the operation voltage Vo varying in accordance with the regulated voltage Vreg, while the drive gate voltage Vg is chosen equal to 1.55 V.

The threshold voltage Vth of the transistor Mt varies with the temperature, accordingly varying the buffered, compensation voltage Vs'. In FIG. 4 the voltages at a temperature of 27° C. are shown in continuous line, at −40° C. in dashed line and at 90° C. in dash-and-dot line. The specific value of the threshold voltage Vth of the transistor Mt depends on the specific technology adopted; a typical value of the threshold voltage Vt may be of 0.45 V at a temperature of 27° C., of about 0.35 V at 90° C. and of about 0.55 V at −40° C.; accordingly, the buffered voltage Vs' takes the value of 1.1 V at 27° C., the value of 1.2 V at 90° C. and the value of 1.0 V at −40° C.

It can be observed that the operating voltage Vo shifts in the direction of the axis of the ordinates V with temperature variations, tracking the threshold voltage of the memory cells. In fact, at 27° C. the operation voltage Vo (continuous line) varies between 0.3 V and about 3.0 V, at −40° C. (dashed line) it varies between about 0.4 V and about 3.1 V, increasing with respect the operation voltage Vo at 27° C., and at 90° C. (dash-and-dot line) it varies between about 0.2 V and about 2.9 V, decreasing with respect the operation voltage Vo at 27° C.

Then, the voltage generator according to embodiments of the present invention ensures optimized read margins also in the case of great temperature variations (for example, from 27° C. to 90° C.); in fact, the operating voltage Vo varies in accordance with the threshold voltage of the memory cells. This temperature compensation is very advantageous in memories with high density, such as the multilevel memories, and in memories manufactured by small feature size processes, which have read margins greatly reduced. Accordingly, a probability of an incorrect reading of the memory cells is decreased.

Although the present invention has been disclosed and described by way of an embodiment, it is apparent to those skilled in the art that several modifications to the described embodiment, as well as other embodiments of the present invention are possible without departing from the scope thereof as defined in the appended claims.

For example, the semiconductor memory can be different from a flash memory, the matrix of memory cells can be arranged in a way different from a NAND architecture and the memory cells need not be multilevel. The memory can include a plurality of voltage generators according to another embodiment of the present invention. The voltage generator can receive a reference voltage from a reference voltage generator different from a band gap generator and the voltage regulator can be implemented in a different way; particularly, the voltage divider can be different from a series of resistors. For varying the operation voltage in accordance with variations of the threshold voltage of the memory cells another device can be exploited in place of a MOS transistor coupled to a resistor.

Memory devices including embodiments of the present invention may be utilized in a variety of different types of electronic devices, such as cellular phones, personal digital assistants, personal and pocket or portable computer systems, and so on. Furthermore, a voltage generator according to embodiments of the present invention may be utilized in a variety of different types of integrated circuits which, in turn, may contain non-volatile memory circuitry, such as microprocessors, digital signal processors, and so on.

From the foregoing it will be appreciated that, although specific embodiments of the invention have been described herein for purposes of illustration, various modifications may be made without deviating from the spirit and scope of the invention.

The invention claimed is:

1. A circuit comprising:
    at least one memory cell to store data, said data corresponding to predetermined values of an electrical characteristic thereof, wherein said electrical characteristic values are affected by a variability with temperature according to a first variation law; and
    a voltage generator to generate a voltage to be supplied to the at least one memory cell for retrieving the data stored therein, the voltage generator including first means to cause the generated voltage to take a value in a set of target values including at least one target value, depending on an operation to be performed on the memory cell,
    wherein the voltage generator further includes second means for causing the value taken by the generated voltage to vary with temperature according to a prescribed second variation law, said second means including a compensation circuit element including a MOS-type variable-conductivity element having a threshold voltage exhibiting a variability with temperature corresponding to the variability of the memory cell to cause the variation of the value taken by the generated voltage.

2. The circuit according to claim 1, in which said set of target values includes at least one first read value used in a memory cell read operation to read the data stored in the at least one memory cell, and at least one second read value used in a data program verify operation to verify data programmed into the memory cell.

3. The circuit according to claim 1, in which:
    said first means include a voltage regulator adapted to generate a regulated voltage taking a value in said set of target values, said regulated voltage exhibiting a variability with temperature according to a third variation law; and
    said second means include:
    compensation voltage generator means adapted to generate a compensation voltage varying with temperature according to a fourth variation law, said compensation voltage generator means including said compensation circuit element; and
    voltage combining means receiving the regulated voltage and the compensation voltage and adapted to combine the regulated voltage and the compensation voltage so as to obtain the generated voltage.

4. The circuit according to claim 3, in which said regulated voltage is essentially stable against temperature variations.

5. The circuit according to claim 4, in which the at least one memory cell includes a MOS-type transistor.

6. The circuit according to claim 5, in which said fourth variation law is such that the variation of the compensation voltage with temperature is proportional to the variation with temperature of the threshold voltage of the MOS-type transistor.

7. The circuit according to claim 6, in which said voltage combining means adapted to combine the regulated voltage with the compensation voltage in such a way that the variation of the generated voltage with temperature is proportional to the variation with temperature of the threshold voltage of the MOS-type transistor.

8. The circuit according to claim 7, wherein the MOS-type variable-conductivity element having a threshold voltage exhibiting a variability with temperature corresponds to that of the threshold voltage of the MOS-type transistor forming the memory cell, said variable-conductivity element having a control terminal receiving a control voltage, and a current-delivery terminal for delivering a current having a value depending on the control voltage and the threshold voltage thereof, the compensation voltage generator means further including a current/voltage converter coupled to the current-delivery terminal for converting the delivered current into said compensation voltage.

9. The circuit according to claim 8, in which said control voltage is generated by the voltage regulator.

10. The circuit according to claim 9, in which the voltage combining means include a voltage summation stage receiving and summing together the regulated voltage and the compensation voltage.

11. The circuit according to claim 10, wherein the voltage summation stage includes:
    an operational amplifier having a first input terminal receiving the regulated voltage, a second input terminal receiving the compensation voltage and an output terminal providing the generated voltage, and
    a feed-back branch having a first node for receiving the compensation voltage, a second node coupled to the second input terminal for supplying the compensation voltage and a third node for coupling in feed-back the output terminal to the second input terminal.

12. The circuit according to claim 3, wherein the voltage regulator includes:

a differential amplifier having a first input terminal for receiving the reference voltage, a second input terminal for receiving a feed-back voltage and a drive terminal for providing a drive voltage corresponding to a comparison between the reference voltage and the feed-back voltage; and a feed-back network for coupling in feed-back the drive terminal and the second input terminal of the differential amplifier, the feed-back network including:

a voltage divider having a feed-back node for providing the feed-back voltage, an output node for providing the regulated voltage, and a further variable-conductivity element coupled to the voltage divider and controller by the drive voltage for regulating the regulated voltage.

13. The circuit according to claim 12, wherein the feed-back network further includes switching means coupled to the voltage divider for causing the value of the regulated voltage selectively take a value in said set of target values.

14. The circuit according to claim 2, wherein the at least one memory cell is a multilevel memory cell adapted to store data including more than one bit by associating different ranges of values of the electrical characteristics to respective logic values, the at least one first value of the generated voltage including a plurality of first values, and the second value of the generated voltage including a plurality of second values.

15. The circuit according to claim 1, in which said at least one memory cell includes a plurality of memory cells arranged in a matrix with a NAND architecture.

16. A method comprising:

generating a voltage, wherein said generating the voltage includes causing the generated voltage take a value in a set of target values including at least one target value, corresponding to an operation to be performed on the memory cell; and supplying the generated voltage to at least one memory cell for retrieving data stored therein, wherein said at least one memory cell is adapted to store the data in terms of values of an electrical characteristic thereof, said electrical characteristic exhibiting a variability with temperature according to a first variation law, wherein said generating the voltage further includes exploiting a compensation circuit element including a MOS-type variable-conductivity element having a threshold voltage exhibiting a variability with temperature corresponding to the variability of the memory cell to cause the value taken by the generated voltage vary with temperature according to a prescribed second variation law.

* * * * *